United States Patent
Lin et al.

(10) Patent No.: US 7,206,721 B1
(45) Date of Patent: Apr. 17, 2007

(54) METHODS AND SYSTEMS OF OFFLINE MEASUREMENT FOR PROCESS TOOL MONITORING

(75) Inventors: Chih-Tsung Lin, Hsinchu (TW); Shui-Tien Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/299,536

(22) Filed: Dec. 12, 2005

(51) Int. Cl.
*G06F 11/30* (2006.01)

(52) U.S. Cl. ............ 702/185; 700/108; 700/121; 702/81; 702/188

(58) Field of Classification Search ............ 702/81, 702/841, 179, 185, 188; 700/108, 121; 707/6, 707/10
See application file for complete search history.

(56) References Cited

U.S. PATENT DOCUMENTS

| | | | |
|---|---|---|---|
| 5,987,398 A * | 11/1999 | Halverson et al. | 702/179 |
| 6,650,958 B1 | 11/2003 | Balazs et al. | 700/121 |
| 6,907,369 B1 * | 6/2005 | Markle et al. | 702/81 |
| 2003/0220768 A1 * | 11/2003 | Perry et al. | 702/168 |
| 2006/0184264 A1 * | 8/2006 | Willis et al. | 700/108 |

\* cited by examiner

*Primary Examiner*—John Barlow
*Assistant Examiner*—John Le
(74) *Attorney, Agent, or Firm*—Thomas, Kayden, Horstemeyer & Risley

(57) ABSTRACT

A method of offline measurement for process tool monitoring applied to semiconductor processes. A self-tuning monitor rule database, storing predefined monitor rules for lot processing is provided. Monitor data related to the lot processing is defined. Desired monitor data is obtained according to selected monitor rules residing in the self-tuning monitor rule database. Offline measurement operations are implemented according to the obtained monitor data using a process tool to generate monitor results. It is determined whether abnormal states exist by comparing the selected monitor rules and monitor data according to the monitor results. If so, the lot processing for the process tool is terminated. If not, the lot processing for the process tool is allowed. A failure notice is sent in response and the selected monitor rules are re-defined to update the self-tuning monitor rule database.

15 Claims, 5 Drawing Sheets

METHODS AND SYSTEMS OF OFFLINE MEASUREMENT FOR PROCESS TOOL MONITORING

BACKGROUND OF THE INVENTION

1. Field of the Invention

The invention relates to semiconductor process control, and more particularly, to offline measurement for process tool monitoring.

2. Description of the Related Art

Offline measurement measures particles on wafers, thickness of wafers, and abnormal situations for tools using offline measurement tools, adjusting tool statuses and settings for process improvement. Current offline measurement techniques suffer from problems described in the following.

FIG. 1 is schematic view of a conventional system of quality control for semiconductor process tool.

Quality control system 100 comprises data collection unit 110 and constraint system 130. Data collection unit 110 collects process/tool control and analysis data related to semiconductor processes. Conventionally, monitor jobs 111 are defined according to engineering experience and monitor rules, comprising, for example, that tool A is monitored every 12 hours, tool B runs 10,000 pieces of wafers at three-hour intervals, tool C runs 1000 lots a day, and so forth. Monitor data 113 are statistical process control (SPC) data, comprising predefined multiple control charts related to semiconductor processes for management and improvement. Applicable monitor jobs are selected and corresponding monitor data (control charts) is obtained accordingly. Next, the selected monitor data is applied to tools 120, thereby generating monitor results 115. Monitor jobs may be re-defined according to monitor results 115 for process/tool management and control.

Constraint system 130 manages and controls tools 120 according to abnormal states, comprising wafer defects, out of control, and the like. Production loss may be caused by tool monitoring failures. As described, monitor jobs 111 are defined by engineering experience and desired monitor data 113 are obtained accordingly for application to generate monitor results 115. Monitor results 115, however, may be ignored or not immediately provided to constraint system 130 for abnormality management and adjustment, such that abnormal states may still occur again if tools are not adjusted.

Routine tool status monitoring is necessary for good wafer quality control. Such monitor actions can prevent defects found in the Wafer Acceptance Test (WAT) or final test. Routinely performing tool monitor can help to locate potential issues early, not only saving the expense of reworking or scrapping but also reducing the risk of shipping date delays. Currently, an average of 104 monitor rule combinations are applied to each tool. Rules are artificially defined to manage and control the tool quality, such that, when hundreds of monitor rules are applied, monitors may miss a rule resulting in scrapping of a process. With respect to U.S. Pat. No. 6,650,958, integrated process tool monitoring system for semiconductor fabrication, reports are transmitted from process tools directly by uploading parameters to a system for verification, and, if the parameters are incorrect, an alarm is transmitted to terminate the tools.

Currently, monitor tasks are artificially conveyed by order instructions to manage and control the tool quality. The main problem is that the tool quality relies on discipline between engineers and operators, such that invalid lot processing is unpreventable. The U.S. Pat. No. 6,650,958 can only support parameter report directly from process tools.

As described, with respect to current methods for process tool monitoring, production loss may occur when monitor jobs are improperly assigned by experience, monitoring jobs are missed, or monitoring results are ignored. Additional drawbacks of current methods comprise redundant monitor jobs affecting productivity, insufficient monitor jobs affecting production quality, and artificial determination of tool quality.

Thus, an improved method for process tool monitoring is desirable.

BRIEF SUMMARY OF THE INVENTION

Systems of offline measurement for process tool monitoring applied to semiconductor processes are provided. An exemplary embodiment comprises a data collection unit, a plurality of offline measurement tools, an offline measurement tool, and a constraint system. The data collection unit further comprises a first database, storing predefined monitor rules related to semiconductor processes, and a second database, storing predefined monitor data related to semiconductor processes. The offline measurement tool implements offline measurement operations according to selected monitor rules from the first database and selected monitor data from the second database to generate monitor results. The selected monitor data is obtained according to the selected monitor rules. The constraint system retrieves the monitor results, determines whether abnormal states exist by comparing the selected monitor rules and monitor data according to the monitor results, and, if so, enables lot processing for the offline measurement tool. If not, the lot processing for the offline measurement tool is terminated, a failure notice is responded, and the selected monitor rules are re-defined to update the first database.

Methods of offline measurement for process tool monitoring applied to semiconductor processes are provided. In an embodiment of such a method, a self-tuning monitor rule database, storing predefined monitor rules for lot processing is provided. Monitor data related to the lot processing is defined. Desired monitor data is obtained according to selected monitor rules residing in the self-tuning monitor rule database. Offline measurement operations are implemented according to the obtained monitor data using offline measurement tools to generate monitor results. It is determined whether abnormal states occur by comparing the selected monitor rules and monitor data according to the monitor results. If so, the lot processing for the offline measurement tools is terminated. If not, the lot processing for the offline measurement tools is allowed. A failure notice is sent in response and the selected monitor rules are re-defined to update the self-tuning monitor rule database.

A machine-readable storage medium storing a computer program which, when executed, performs the method of offline measurement for process tool monitoring is also disclosed.

BRIEF DESCRIPTION OF THE DRAWINGS

The present invention can be more fully understood by reading the subsequent detailed description and examples with references made to the accompanying drawings, wherein:

FIG. 2 is a schematic view showing . . .

DETAILED DESCRIPTION OF THE INVENTION

Figure 1:
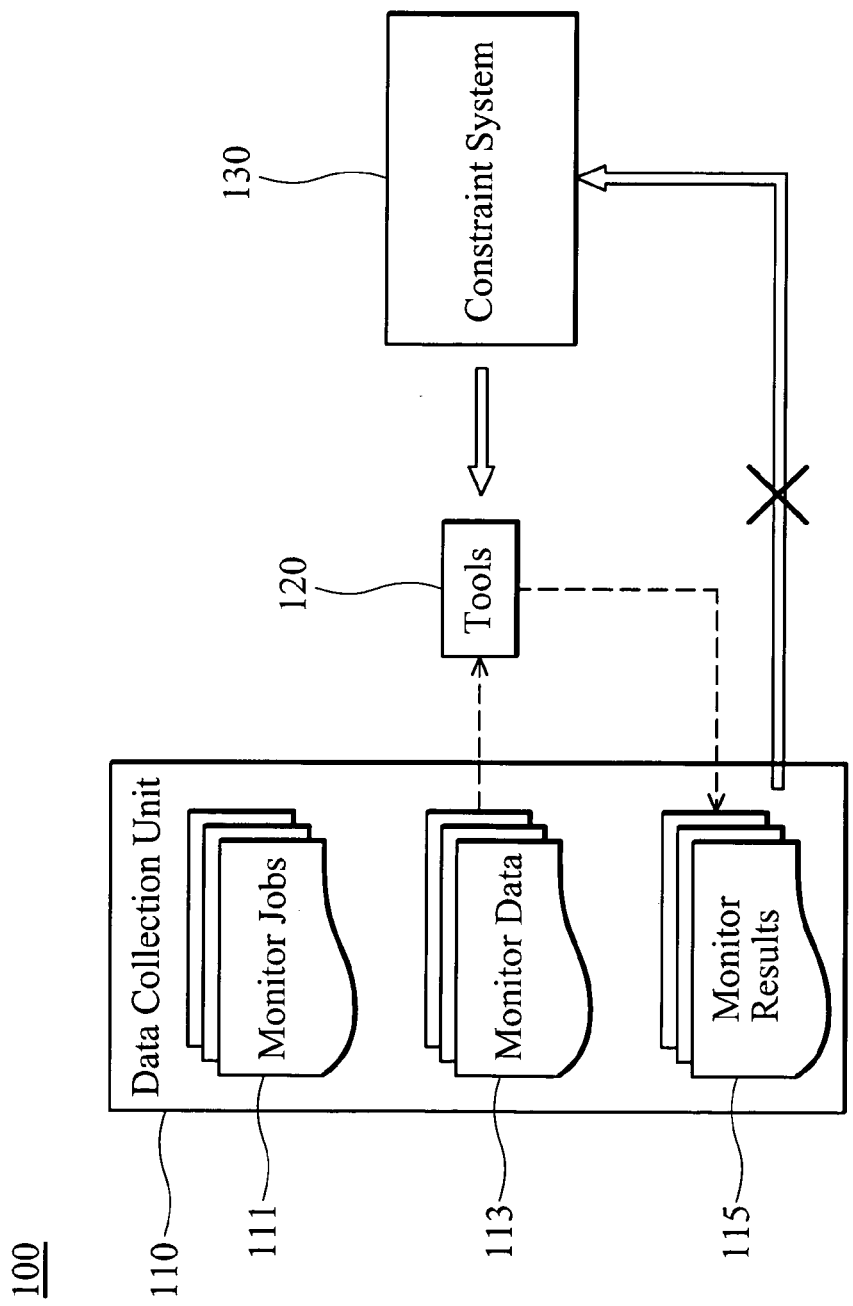
FIG. 1 is schematic view of a conventional system of quality control for semiconductor process tools.

Several exemplary embodiments of the invention are described with reference to FIGS. 2 through 5, which generally relate to process tool monitoring. It is to be understood that the following disclosure provides many different embodiments as examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
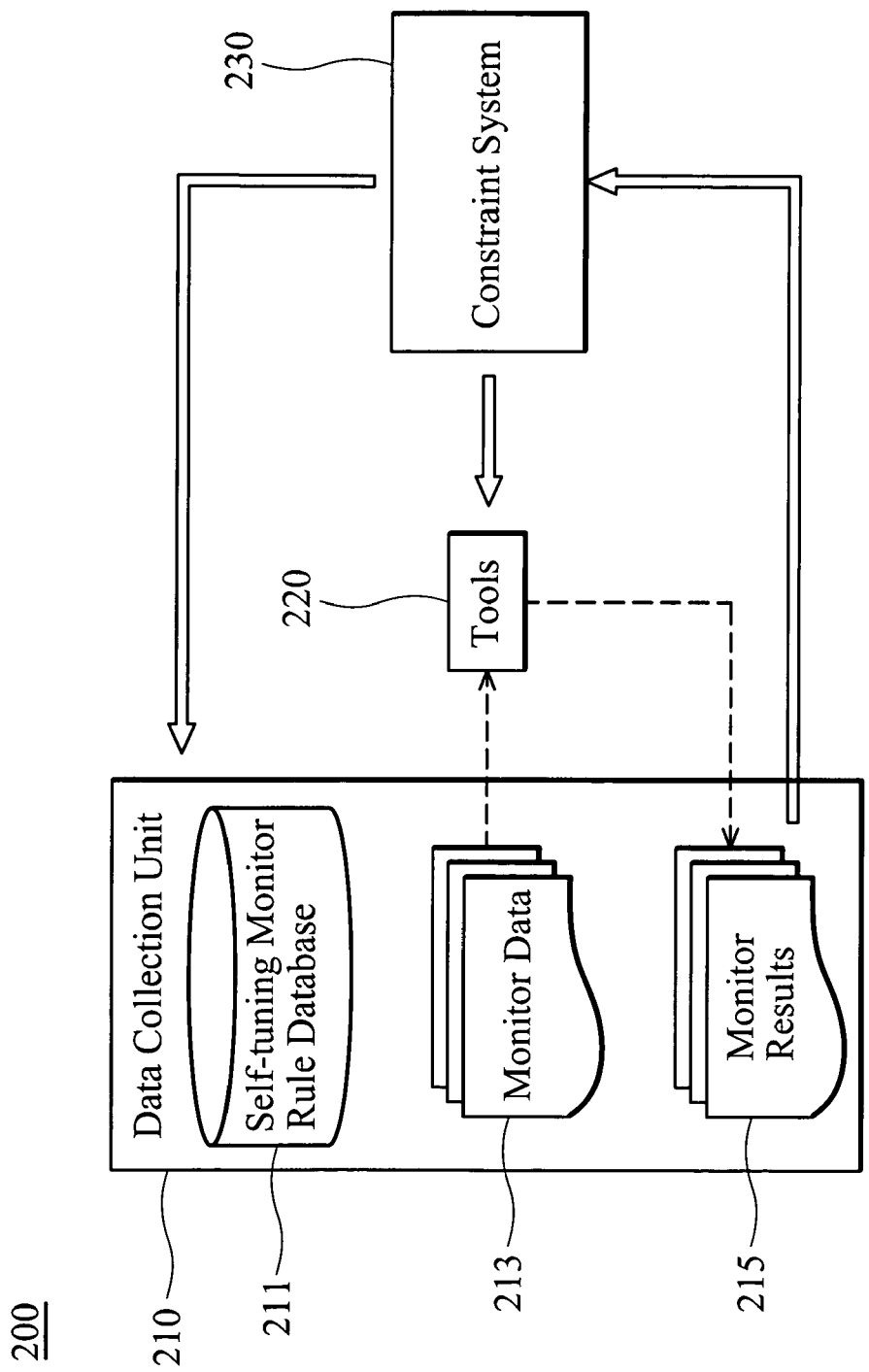
FIG. 2 is a schematic view of an embodiment of a system of quality control for semiconductor process tools.

FIG. 2 is a schematic view of an embodiment of a system of quality control for semiconductor process tool.

Quality control system 200 comprises data collection unit 210 and constraint system 230. Data collection unit 210 further comprises a self-tuning monitor rule database 211, storing predefined process/tool control and analysis rules and updated during lot processing. Tool A, for example, originally monitored every 12 hours may be monitored every 6 hours if abnormal states occur frequently. Tool B, for example, originally running 1000 wafer lots a day may run 2000 wafer lots a day if tool loading thereof is light. Process tools 220 process wafer lots according to monitor rules residing in self-tuning monitor rule database 211 and corresponding monitor data 213, and the resulting are analyzed to generate monitor results 215. Monitor data 213, as described, are SPC data, comprising predefined control charts related to semiconductor processes for management and improvement.

Monitor results 215 are generated and automatically transmitted to constraint system 230. Next, constraint system 230 compares monitor rules and monitor data 213 according to monitor results 215 to determine whether monitor rules are correctly defined, and, if so, tools 220 are allowed for lot processing. When monitor rules are expired or out of control, constraint system 230 responds to data collection 210 to adjust and update monitor rules stored in self-tuning monitor rule database 211. The described comparison is implemented by checking if monitor results are out of specification by getting point values and calculating the counts accumulated since the last monitor operation by getting the last SPC point timestamp. The specification of monitor rules comprises chamber, recipe, frequency, and trigger events. Count units of frequency are time period or run/lot/wafer count or accumulative report from a tool.

Figure 3:
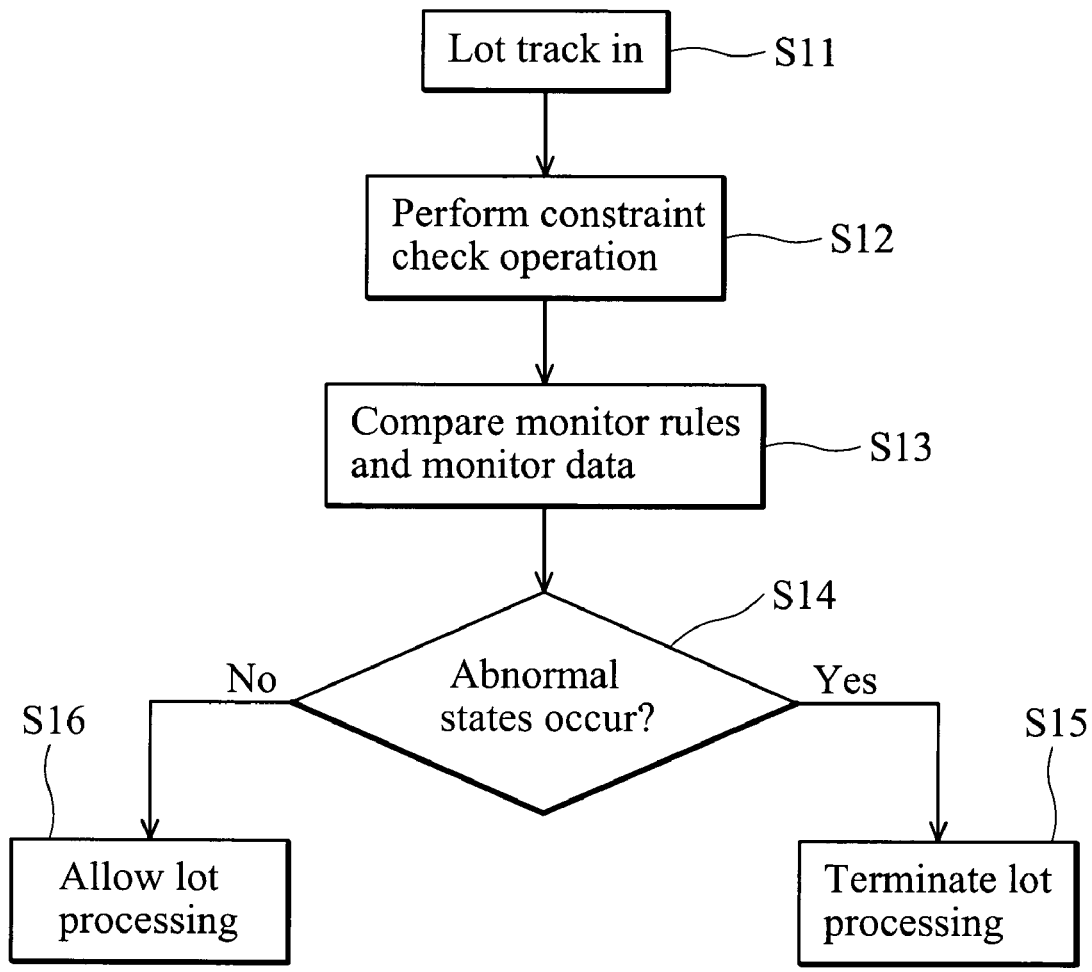
FIG. 3 is a flowchart of an embodiment of a method for tool constraint.

FIG. 3 is a flowchart of an embodiment of a method for tool constraint. Lot processing for constraint system 230 is further described. When lots are tracked in tools (step S11), constraint system 230 performs a constraint check operation (step S12) and compares monitor rules and monitor data (step S13) to determine whether abnormal states occur (step S14). If so, lot processing is terminated (step S15), and, if not, is allowed (step S16).

Figure 4:
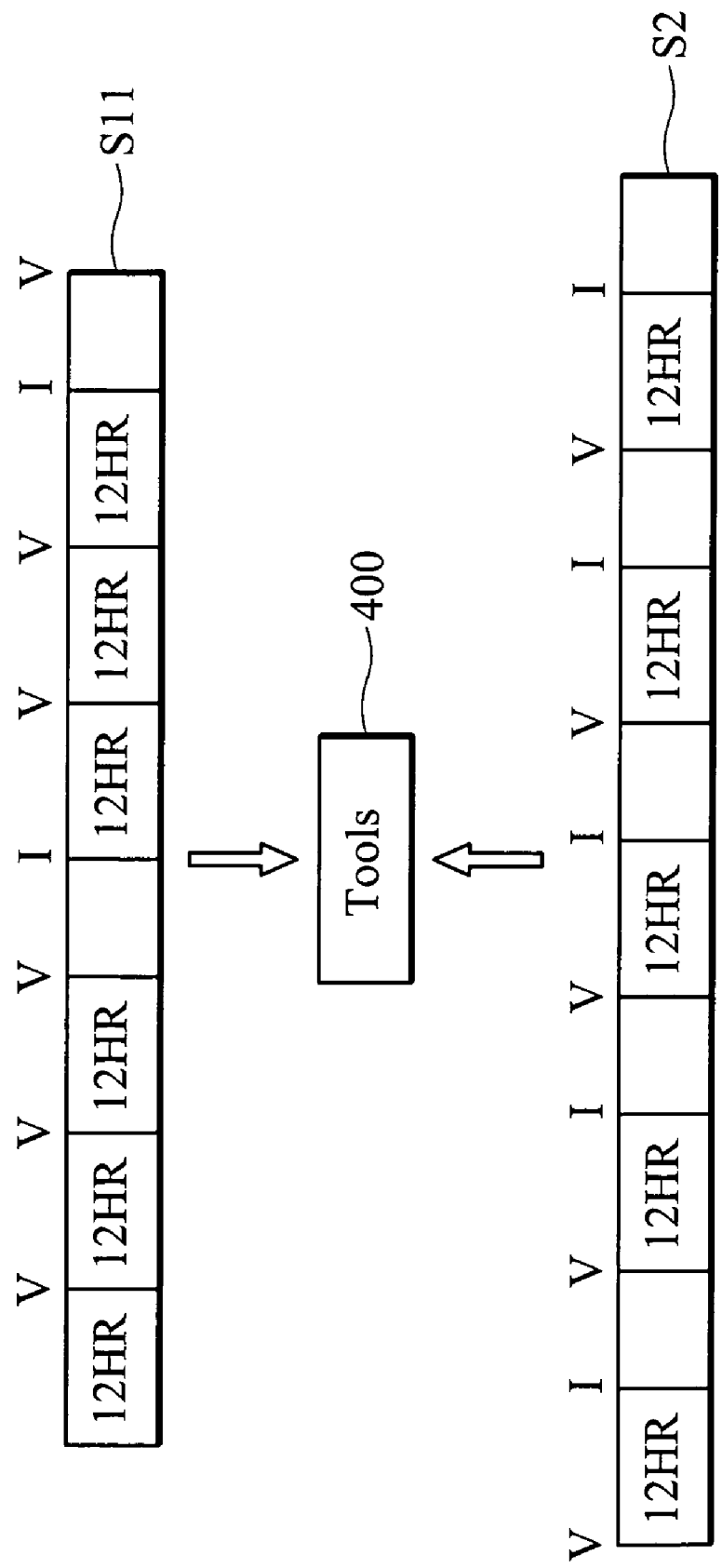
FIG. 4 is a schematic view of an example for self-tuning monitor rules.

FIG. 4 is a schematic view of an example for self-tuning monitor rules.

A monitor rule is defined for monitor tool 400 at 12-hour intervals, where the symbol "V" represents the tool is in a valid state and the symbol "I" represents the tool in an invalid state. Abnormal states of tool 400 occur when the third monitor period is complete (every 36 hours), as shown by S11. Thus, considering production cost and efficiency, the monitor period (12 hours) should be lengthened to 15 hours, 20 hours, or more. Further, abnormal states of tool 400 occur at the end of every monitor period (every 12 hours), as shown by S2. Thus, considering production cost and efficiency, the monitor period (12 hours) should be shortened to 10 hours, 8 hours, or less.

Figure 5:
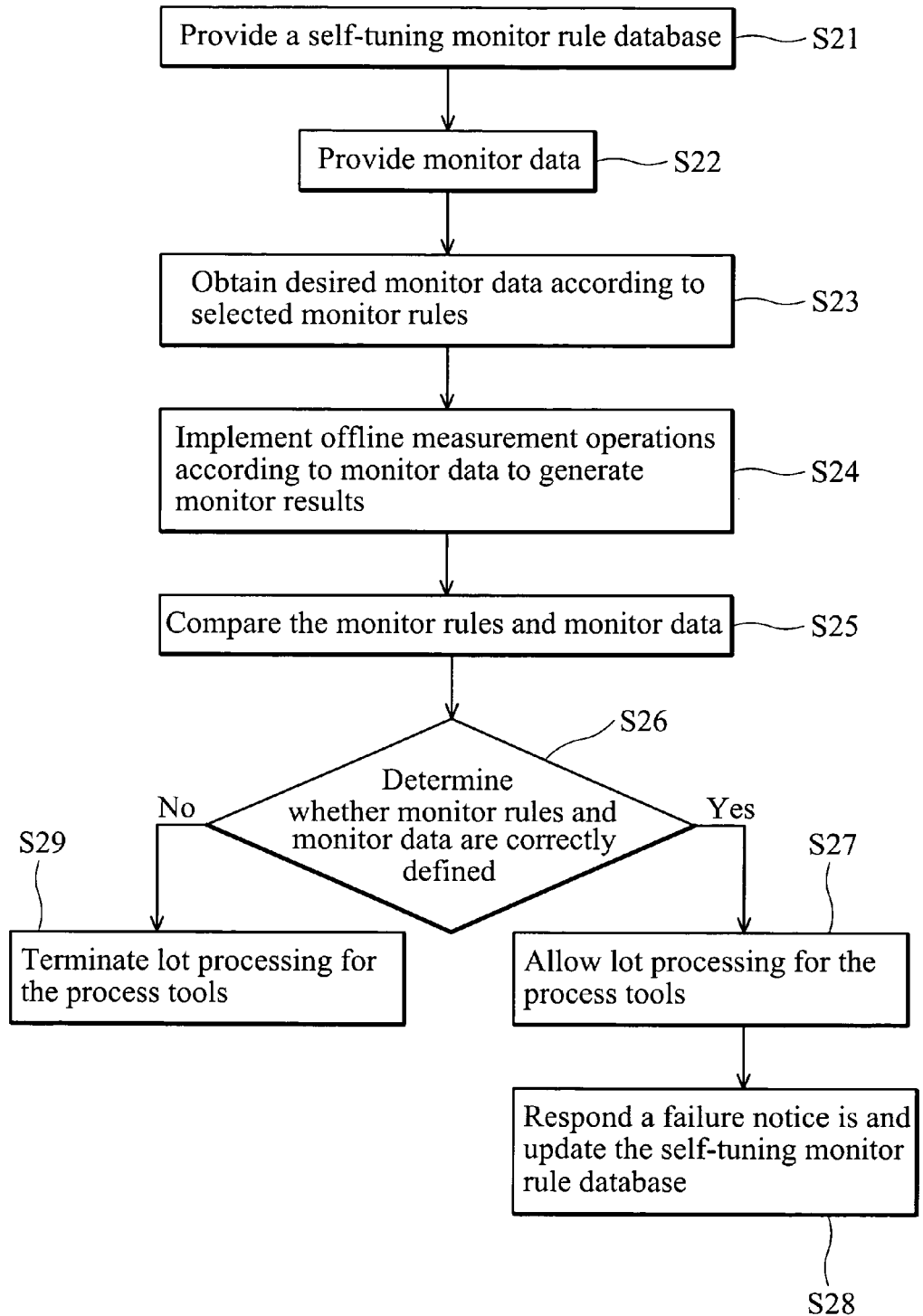
FIG. 5 is a flowchart of an embodiment of a method of offline measurement for process tools.

FIG. 5 is a flowchart of an embodiment of a method of offline measurement for process tool.

A self-tuning monitor rule database, storing predefined monitor rules for lot processing, is provided (step S21). Monitor data, comprising predefined control charts related to semiconductor processes for lot processing, is defined (step S22). Desired monitor data is obtained according to selected monitor rules residing in the self-tuning monitor rule database (step S23). Offline measurement operations are implemented according to the obtained monitor data using process tools to generate monitor results (step S24). The selected monitor rules and obtained monitor data are compared according to the monitor results (step S25) to determine whether monitor rules and monitor data are correctly defined (step S26). If so, lot processing for the process tools is allowed (step S27). If not, lot processing for the process tools is terminated (step S28), a failure notice is sent in response, and the selected monitor rules are re-defined to update the self-tuning monitor rule database (step S29).

The invention integrates data collection and constraint functions for tool monitoring and monitor rules are appropriately updated to improve lot processing. Additionally, monitor rules are assigned according to tool states and feedback of monitor results are automatically implemented, such that production is loss reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A system of offline measurement for process tool monitoring applied to semiconductor processes, comprising:
    a data collection unit, further comprising:
    a first database, storing predefined monitor rules related to the semiconductor processes; and
    a second database, storing predefined monitor data related to the semiconductor processes;
    a process tool, coupled to the data collection unit, implementing offline measurement operations according to selected monitor rules from the first database and selected monitor data from the second database to generate monitor results, wherein the selected monitor data is obtained according to the selected monitor rules;
    a constraint system, coupled to the data collection unit, retrieving the monitor results, determining whether abnormal states exist by comparing the selected monitor rules and monitor data according to the monitor results, if so, enabling lot processing for the process tool, if not, terminating the lot processing for the process tool, responding with a failure notice, and re-defining the selected monitor rules to update the first database.

2. The system of offline measurement for process tool monitoring as claimed in claim 1, wherein the constraint system further enables, or disables, lot processing for the process tool according to the updated monitor rules and corresponding monitor data.

3. The system of offline measurement for process tool monitoring as claimed in claim 1, wherein the constraint system further checks whether the monitor results are out of specification by obtaining point values for determining the quality of lot processing.

4. The system of offline measurement for process tool monitoring as claimed in claim 3, wherein the constraint system further calculates the counts accumulated since the last monitor operation by obtaining the last statistical process control point timestamp for determination the quality of lot processing.

5. The system of offline measurement for process tool monitoring as claimed in claim 1, wherein the monitor comprises control charts related to the semiconductor processes.

6. A method of offline measurement for process tool monitoring applied to semiconductor processes, comprising:
   providing a self-tuning monitor rule database, storing predefined monitor rules for lot processing;
   defining monitor data related to the lot processing;
   obtaining desired monitor data according to selected monitor rules residing in the self-tuning monitor rule database;
   implementing offline measurement operations according to the obtained monitor data using a process tool to generate monitor results;
   determining whether abnormal states exist by comparing the selected monitor rules and monitor data according to the monitor results;
   if so, terminating the lot processing for the process tool;
   if not, enabling the lot processing for the process tool; and
   responding with a failure notice and re-defining the selected monitor rules to update the self-tuning monitor rule database.

7. The method of offline measurement for process tool monitoring as claimed in claim 6, further comprising enabling, or disabling, the lot processing for the process tool according to the updated monitor rules and corresponding monitor data.

8. The method of offline measurement for process tool monitoring as claimed in claim 6, wherein abnormal state determination further checks whether the monitor results are out of specification by obtaining point values for determining the quality of lot processing.

9. The method of offline measurement for process tool monitoring as claimed in claim 8, wherein abnormal state determination further calculates the counts accumulated since the last monitor operation by obtaining last statistical process control point timestamp for determining the quality of lot processing.

10. The method of offline measurement for process tool monitoring as claimed in claim 6, wherein the monitor comprises control charts related to the lot processing.

11. A computer-readable storage medium storing a computer program providing a method of offline measurement for process tool monitoring, comprising using a computer to perform the steps of:
   providing a self-tuning monitor rule database, storing predefined monitor rules for lot processing;
   defining monitor data related to the lot processing;
   obtaining desired monitor data according to selected monitor rules residing in the self-tuning monitor rule database;
   implementing offline measurement operations according to the obtained monitor data using a process tool to generate monitor results;
   determining whether abnormal states exist by comparing the selected monitor rules and monitor data according to the monitor results;
   if so, terminating the lot processing for the process tool;
   if not, enabling the lot processing for the process tool; and
   responding with a failure notice and re-defining the selected monitor rules to update the self-tuning monitor rule database.

12. The computer-readable storage medium as claimed in claim 11, further comprising enabling, or disabling, the lot processing for the process tool according to the updated monitor rules and corresponding monitor data.

13. The computer-readable storage medium as claimed in claim 11, wherein abnormal state determination further checks whether the monitor results are out of specification by obtaining point values for determination the quality of lot processing.

14. The computer-readable storage medium as claimed in claim 13, wherein abnormal state determination further calculates the counts accumulated since the last monitor operation by getting last statistical process control point timestamp for determination of lot processing.

15. The computer-readable storage medium as claimed in claim 11, wherein the monitor comprises control charts related to the lot processing.

* * * * *